(12) United States Patent
Omori et al.

(10) Patent No.: US 9,866,204 B1
(45) Date of Patent: Jan. 9, 2018

(54) LATCH CIRCUIT WITH ISOLATED INPUT AND/OR OUTPUT

(71) Applicant: Lockheed Martin Corporation, Bethesda, MD (US)

(72) Inventors: Toshi Omori, Manlius, NY (US); Brandon R. Davis, Phoenix, AZ (US); Lloyd F. Linder, Agoura Hills, CA (US); Victoria T. Pereira, Moorestown, NJ (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 15/184,395

(22) Filed: Jun. 16, 2016

(51) Int. Cl.
 *H03K 3/286* (2006.01)
 *H03K 3/2885* (2006.01)
(52) U.S. Cl.
 CPC .................................. *H03K 3/2885* (2013.01)
(58) Field of Classification Search
 None
 See application file for complete search history.

(56) References Cited

U.S. PATENT DOCUMENTS

| | | | | | |
|---|---|---|---|---|---|
| 5,721,503 | A | * | 2/1998 | Burns ................... | B82Y 10/00 326/52 |
| 5,889,487 | A | * | 3/1999 | Burns ................... | B82Y 10/00 327/199 |
| 8,085,079 | B2 | * | 12/2011 | Tran ........................ | H03H 15/00 327/361 |
| 2005/0030216 | A1 | | 2/2005 | Linder et al. | |
| 2005/0035788 | A1 | | 2/2005 | Devendorf et al. | |

OTHER PUBLICATIONS

Sone, K. et al., "A 10b 100Ms/s pipelined subranging BiCMOS ADC," Solid-State Circuits Conference, 1993, Digest of Technical Papers, 40th ISSCC., 1993, IEEE International, pp. 66-67.
Sone, K. et al. "A 10-b 100-Msample/s pipelined subranging BiCMOS ADC", Solid-State Circuits, IEEE Journal, vol. 28, Issue 12, 1993, pp. 1180-1186.

* cited by examiner

*Primary Examiner* — Long Nguyen
(74) *Attorney, Agent, or Firm* — Howard IP Law Group, P.C.

(57) ABSTRACT

A latch circuit providing isolated input current paths includes a pair of input transistors that receive a differential input signal. A plurality of steering transistors receive a portion of a differential clock signal. The latch circuit includes a positive output node and a negative output node. A first bypass input current path is associated with the first input transistor and is electrically isolated from the positive output node and the negative output node. A second bypass input current path associated with the second input transistor is also electrically isolated from the positive output node and the negative output node. In a latched state, the clock signal is operative to selectively bias the plurality of steering transistors such that current is steered to one of the first input current path or the second input current path, thereby being isolated from the output nodes.

17 Claims, 9 Drawing Sheets

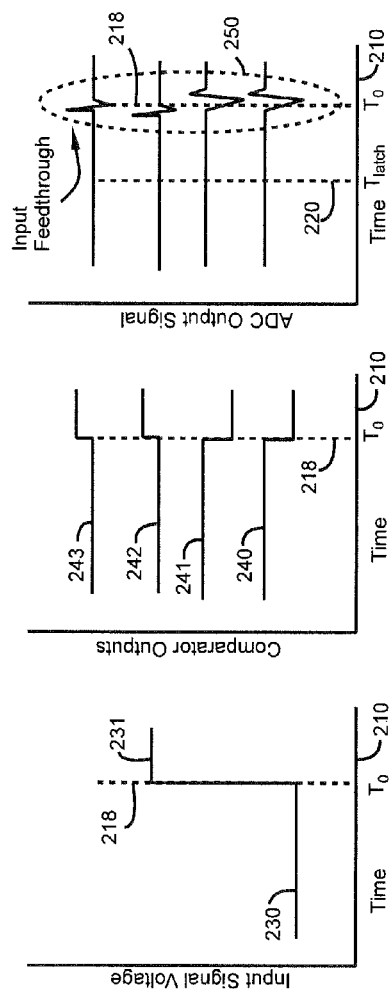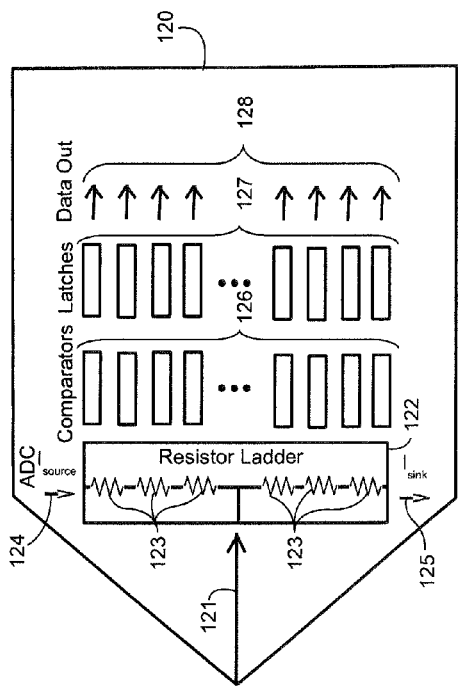
FIG. 2D prior art
FIG. 2C prior art
FIG. 2B prior art
FIG. 2A prior art

LATCH CIRCUIT WITH ISOLATED INPUT AND/OR OUTPUT

FIELD OF THE INVENTION

The application relates to semiconductor-based circuitry. In particular, the application relates to latch circuits.

BACKGROUND OF THE INVENTION

A sub-ranging analog to digital converter (ADC) uses a resistor ladder and an array of comparators in order to quantize an input voltage to a series of bits. The bits are then latched to a held value and sent to a digital to analog converter (DAC) in order to subtract the quantized value from the input voltage, resulting in a residual voltage which is quantized at a finer value at a subsequent quantizing stage in the sub-ranging ADC.

FIG. 1 is a schematic block diagram illustrating a sub-ranging ADC architecture 100. In a typical sub-ranging ADC architecture, a series of pipeline connected ADC/DAC pairs (labeled in stages a and b) are used to convert a corresponding portion of the analog input signal 101. Each ADC/DAC pair utilizes ADC 120 to generate a digital value that is provided to encoder 140. Referring to the architecture shown in FIG. 1, sample and hold circuit 110 samples the analog input signal 101 and stores the sampled voltage values. The voltage samples are input to ADC 120. ADC 120 converts the sampled voltage levels to a digital sample value in encoder 140. The sub-ranging ADC architecture 100 comprises a number of pipelined stages, where each stage includes a quantizer 130. Quantizer 130 includes an ADC 120, encoder 140 and a DAC 150. Each quantizer 130 processes a portion of the digital output signal. For example, each quantizer 130 may encode a given number of bits of the final digital output. The portion of the signal encoded by the quantizer 130 is converted back to an analog signal by DAC 150. The analog output signal 151 is subtracted from the previous stage's input signal 111 output from DAC 150 via summing circuit 160. The stage a output 161 is further processed in similar manner by second sample and hold 110 (stage b) and second ADC 120 and second DAC 150 with the digital output being provided by second encoder 140. The resulting net output signal (e.g. residual signal 161) is processed by the subsequent quantizer stage to produce the next portion of the digital output signal for the sub-ranging ADC 100. Thus, the output signal 161 of a previous quantizer stage serves to provide the input for the next quantizer stage defining a pipelined process. This pipelined process continues over each quantizing stage until all portions of the initial input signal have been converted to digital signals. The resulting digital outputs of the quantizing stages are combined to form the final digital output.

ADC 120 may be a flash (or parallel) ADC 120 which includes a resistor ladder 122 and a comparator 126 associated with each resistor 123 in the resistor ladder 122. The input signal voltage 121 crosses each resistor 123 in resistor ladder 122, and the associated comparator 126 determines whether the input signal voltage is higher (or lower) than the voltage across resistors 123 determined by a reference current flowing through resistor ladder 122. The comparators 126 output a zero or one value to indicate whether or not the input signal voltage 121 value exceeds the voltage level for a corresponding resistor 123. The comparator output is sent to a latch 127 to control the time at which the output values from the comparators may change. The output data 128 is then output from the latches 127 and output to the encoder 140 and the DAC 150 of the quantizer 130 stage.

As the quantized value is being held in the latch circuit 127, the input voltage 121 may change and cause one or more of the comparators 126 to flip the value of their output bits. This change in comparator output value may create glitches which feed through the latch circuit 127 in the form of input feed-through, which degrades the residual voltage value and degrades performance of the sub-ranging ADC.

These glitches are illustrated with reference to FIG. 2A through FIG. 2D. FIG. 2A shows the ADC 120 of FIG. 1 depicting analog input signal 121, and resistor ladder 122 which provides voltage signals to comparators 126. Comparators 126 produce digital output signals which are input to latch circuits 127. The latched bits from comparators 126 are provided as output bits 128, after which latch circuits 127 may be unlatched to receive the next series of digital outputs from comparators 126. FIG. 2B, FIG. 2C and FIG. 2D are graphical depictions of the input signal voltage, the comparator outputs and the ADC output signal, respectively, as a function of time 210. FIGS. 2B, 2C and 2D illustrate a common time interval along their horizontal axes 210. Referring to FIG. 2D, latch circuits 127 are placed in a latched state at time $T_{latch}$ 220. At time $T_0$ 218, the input signal 121, shown in FIG. 2B, changes from a first voltage level 230 to a second voltage level 231. At $T_0$, the latch circuits 127 are latched and the output of latches 127 should not change despite the change in input voltage 121 at $T_0$. However, as the input voltage 121 changes, comparators 126 are provided the new voltage levels from resistor ladder 122, which may cause some of the comparator outputs to flip. As shown in FIG. 2C, comparator outputs 240 and 241 flip to a low state, while comparator outputs 242 and 243 remain high at $T_0$. These state changes in the comparator outputs are fed through to the latched latch circuits 127 and cause perturbations or glitches in the latch output, shown at $T_0$ in FIG. 2D denoted as 250.

Glitches caused by input feed-through create degradation in performance that either must be tolerated or compensated for. For example, one attempt to address this problem involves muting the comparators to prevent comparator flip while the latch circuit is latched and the output is set. The comparators may be set to a predetermined value at a given time during the latch setting interval. In this way, the comparators do not change their output value and feed-through to the latch circuit while it is latched. However, this solution effectively disables the comparators from the time the comparators are set to their predetermined value until the latch circuit is released or unlatched. During this time the comparators will not sense changes in the input signal. A device and method for reducing feed-through in the latch circuit without affecting other components in the quantizing stage of the sub-ranging ADC are desired.

SUMMARY

A sub-ranging ADC includes a number of quantizing stages. Each quantizing stage includes a latch circuit having an isolated input and isolated output, such that, flipping the input bit while the latch circuit is latched does not cause an input feedthrough to the output voltage of the latch circuit. A current mode logic (CML) comparator architecture is implemented by dummying the latch current paths for the input and dummying the unlatch current path for the output.

According to an embodiment, a latch circuit providing isolated input current paths includes a pair of input transistors that receive a differential input signal. A plurality of steering transistors receive a portion of a differential clock signal. The latch circuit includes a positive output node and a negative output node. A first bypass input current path is coupled to the first input transistor and is electrically isolated from the positive output node and the negative output node. A second bypass input current path is coupled to the second input transistor and is also electrically isolated from the positive output node and the negative output node. In a latched state, the clock signal selectively biases the plurality of steering transistors such that current is steered to one of the first input current path or the second input current path, thereby being isolated from the output nodes.

According to another embodiment, a method of preventing input feed-through in a latch circuit includes defining a first bypass input current path isolated from the output nodes of the latch circuit. The first bypass input current path is coupled to a first input transistor of the latch circuit. The method further includes defining a second bypass input current path, which is also isolated from output nodes of the latch circuit, and is coupled to a second input transistor of the latch circuit. A first current source is connected to one or more input current paths of the circuit and a second current source is connected to one or more output current paths of the circuit. The method further includes applying a clock signal to a plurality of steering transistors, to cause the latch circuit to operate in one of a first latched state, and a second unlatched state wherein in the first latched state, steering an input current associated with one of the first and second input transistors and through at least one of the first bypass input current path and the second bypass input current path.

BRIEF DESCRIPTION OF THE DRAWINGS

This description may be better understood with reference to the accompanying figures which include:

FIG. 2A is a block diagram of an ADC portion of a quantizing stage in the sub-ranging ADC of FIG. 1;

FIG. 2B is a graphical illustration of an input signal of the ADC portion shown in FIG. 2A;

FIG. 2C is a graphical illustration of the input to the latch circuits of the ADC portion shown in FIG. 2A;

FIG. 2D is a graphical illustration of the output of the latch circuit of the ADC portion shown in FIG. 2A at $T_0$ when the latches are in a latched state;

FIG. 3A is a schematic diagram of a prior art latch circuit, which is susceptible to input feed-through;

DETAILED DESCRIPTION

Figure 1:
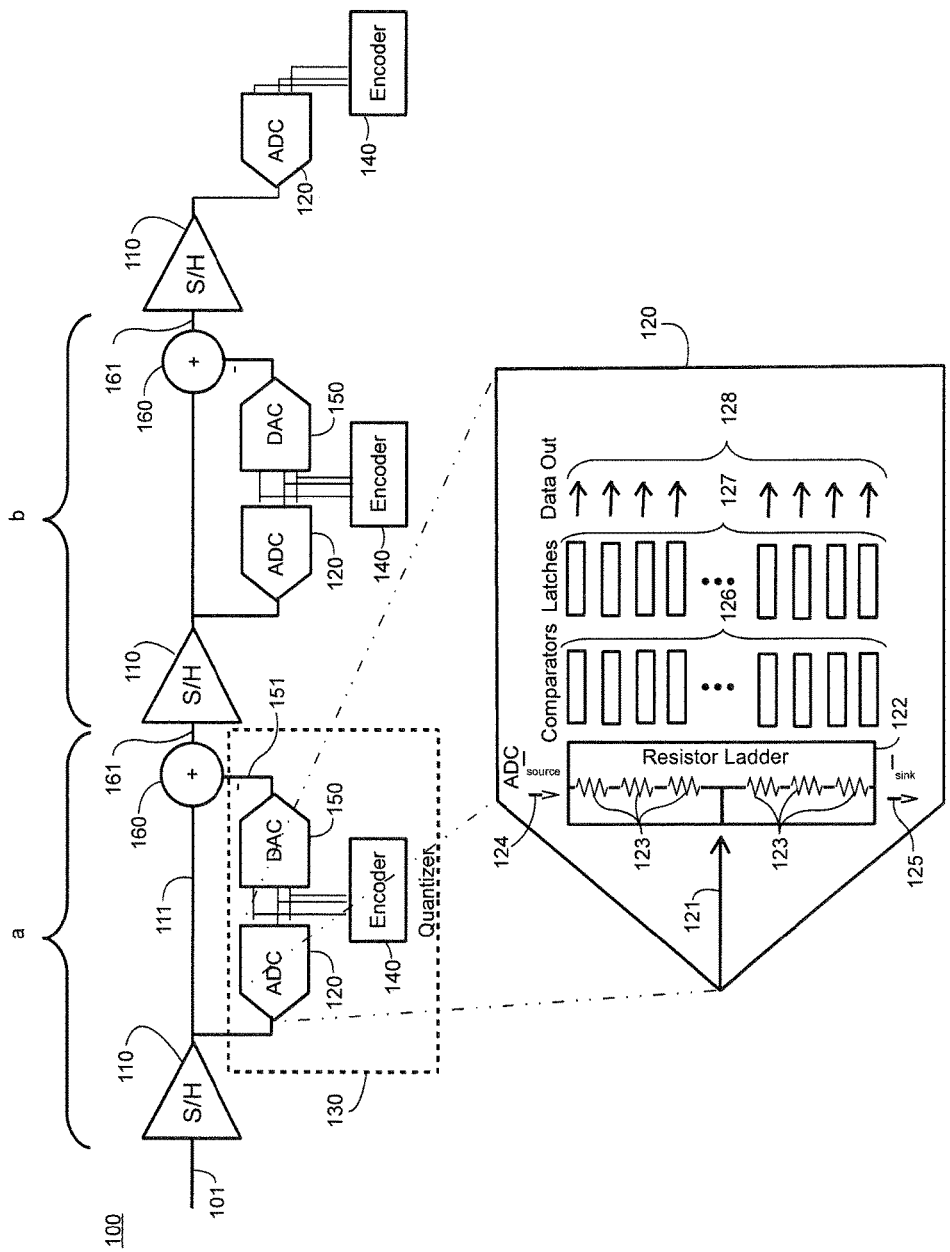
FIG. 1 is a block diagram generally illustrating a conventional sub-ranging ADC.
Figure 3A:
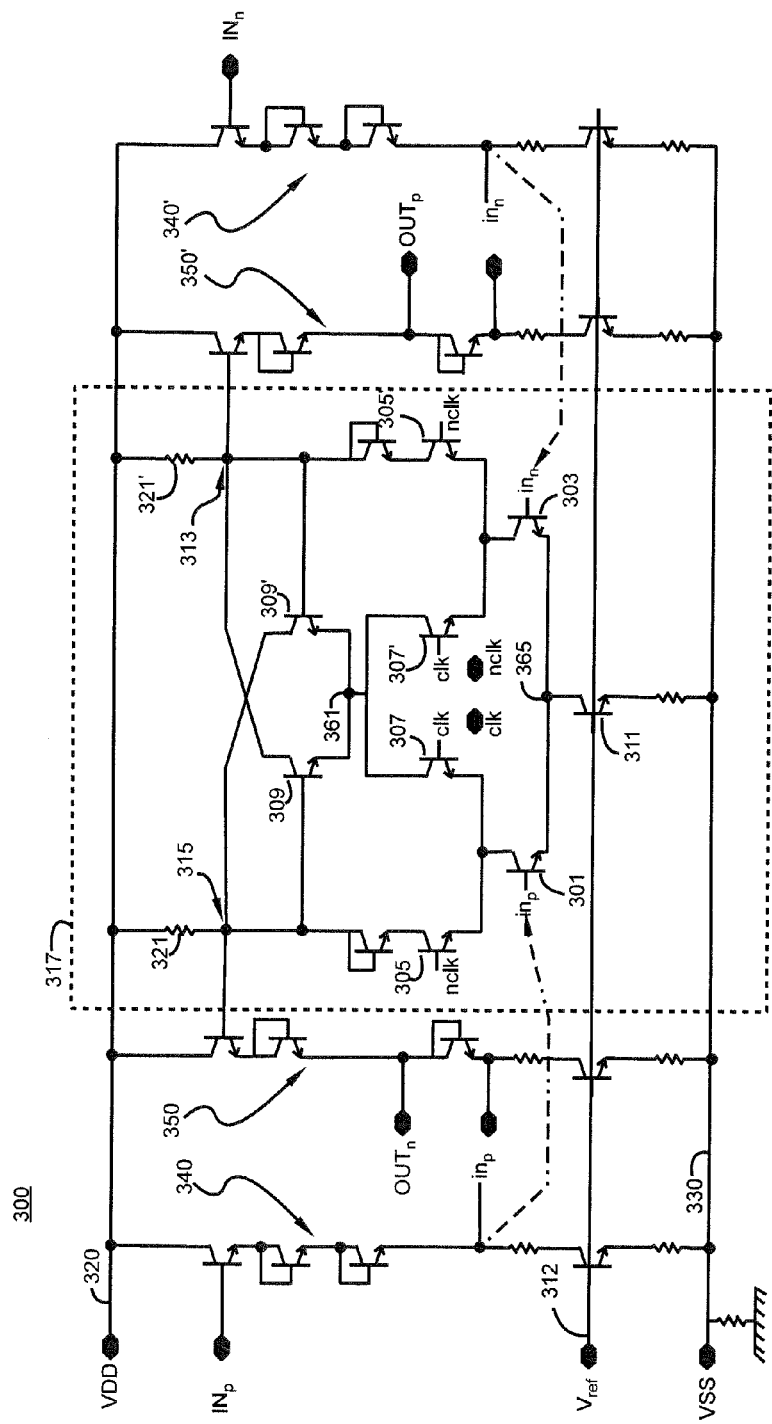

FIG. 3A is a circuit diagram of a latch circuit 300 which is susceptible to input feed-through. Latch circuit 300 is configured to operate based on a differential clock signal (CLK, NCLK) provided at bases of transistors 305, 305', 307 and 307'. Latching occurs within the circuitry denoted by region 317. It is understood that although the drawings illustrate NPN transistor devices, FETs or other electronic biasing components may be used to implement aspects of the present disclosure. Latch circuit 300 further includes input conditioning circuitry 340 and 340' as well as output conditioning circuitry 350 and 350'.

A differential input signal is received at input transistor 301 and input transistor 303. Depending on the input signal, one of input transistors 301 and 303 will be biased to a conducting state while the other is biased to non-conducting state. Similarly, only one pair of transistors associated with the differential clock signal CLK and NCLK, will be biased to conduct current at any given time depending on the state of the differential clock signal. In a latched state, transistors 307 and 307' receive clock signal CLK at their base electrodes and conduct current through one of transistors 309 and 309' dependent upon the present input signal state. In an unlatched state, transistors 305 and 305' receive clock signal NCLK at their base electrodes and are biased to a conducting state which draws current across output node 315 (e.g. negative output node) or 313 (e.g. positive output node), dependent on the value of the input signal.

A current source is defined by transistor 311 which is biased by a reference voltage $V_{ref}$ 312. Transistor 311 is commonly connected at its collector (drain) to input transistors 301 and 303 which receive a differential input signal $in_p$ and $in_n$ at their base (gate) electrodes. With reference to input transistor 301, input transistor 301 is commonly connected at its collector electrode to transistor 305 and transistor 307, which receive a differential clock signal denoted CLK and NCLK which is used to control the state of the latch circuit 300. Transistor 305 receives signal NCLK at its base electrode. Transistor 307 receives signal CLK at its base electrode. The collector of transistor 305 is connected to negative output node 315 which is connected to reference voltage VDD 320 via resistor 321. Transistor 307 is connected at its collector electrode to the emitter (source) electrodes of transistors 309 and 309'. The collector of transistor 309' is connected to the negative output node 315, and the collector of transistor 309 is connected to the positive output node 313. With reference to input transistor 303, input transistor 303 is commonly connected at its collector electrode to transistor 305' and transistor 307', which receive a differential clock signal denoted CLK and NCLK.

The differential clock signal is used to control the state of the latch circuit 300. Transistor 305' receives signal NCLK at its base electrode. Transistor 307' receives signal CLK at its base electrode. The emitter of transistor 305' is connected to positive output node 313 which is connected to reference voltage VDD 320 via resistor 321'. Transistor 307' is connected at its collector electrode to the emitter electrodes of transistors 309 and 309'. The collector of transistor 309' is connected to negative output node 315, and the collector of transistor 309 is connected to positive output node 313. The base electrode of transistor 309' is connected to positive output node 313 and the base electrode of transistor 309 is connected to negative output node 315.

Figure 3B:
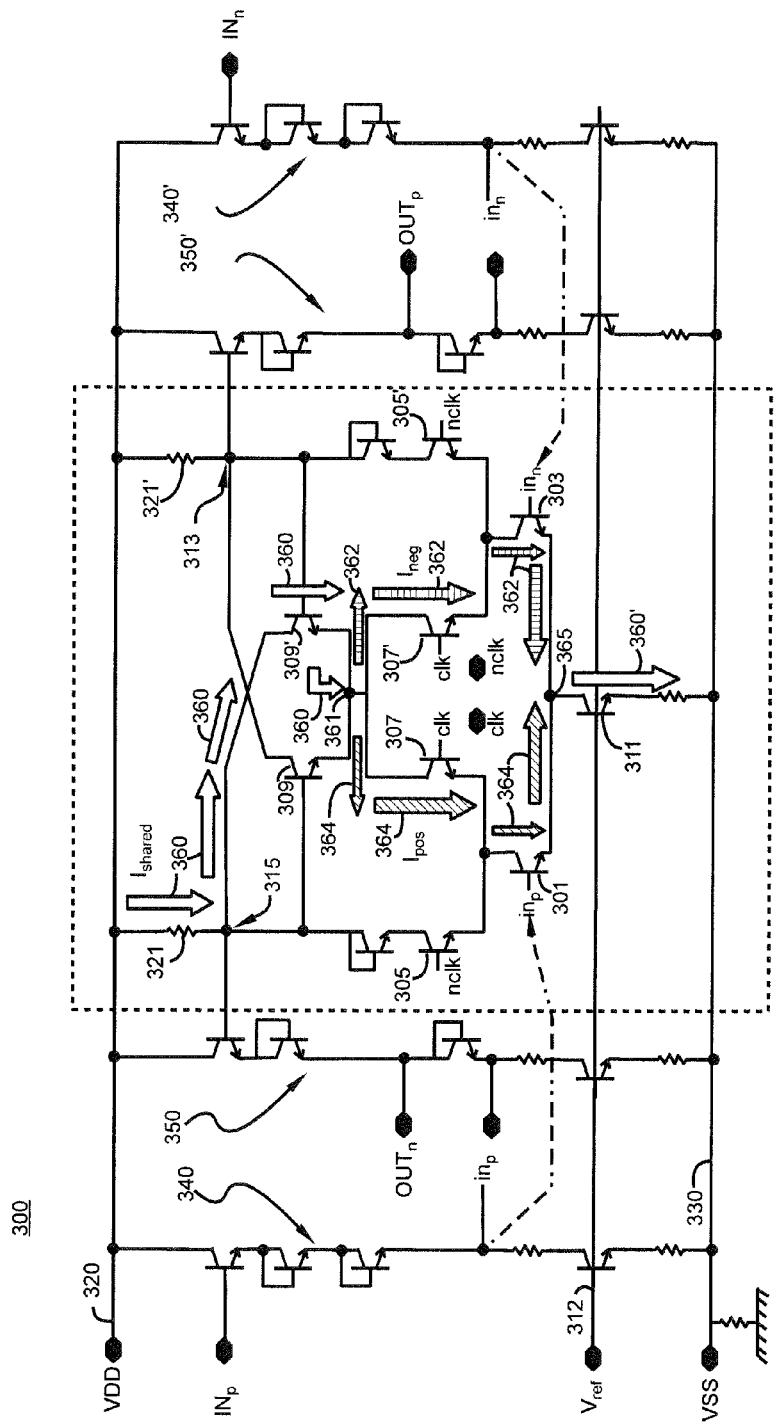
FIG. 3B is a schematic diagram of the latch circuit of FIG. 3A illustrating current flows through the latch circuit when the latch circuit is in a latched state.

Referring now to FIG. 3B, latch circuit 300 of FIG. 3A is shown illustrating current flow in the circuit while the latch circuit 300 is in a latched state. Latch circuit 300 is placed into a latched state by controlling the differential clock signal CLK and NCLK applied at the base electrodes of transistors 305, 305', 307 and 307'. When latched, clock signal CLK biases transistors 307 and 307' in a conducting state allowing current to flow through transistors 307 and 307'. Clock signal NCLK places transistors 305 and 305' into a non-conducting state preventing current flow through transistors 305 and 305'.

At the time latch circuit 300 is placed into a latched state, the last output signal present at the output nodes 313 and 315 will be maintained during the time interval during which the latch circuit 300 remains latched. In the example shown in FIG. 3B, the output signal present at the time the latch circuit 300 was latched was positive. When signal CLK causes transistors 307 and 307' to turn on, the negative output signal biases transistor 309' to turn on and common current path $I_{shared}$ 360 is drawn through resistor 321, negative output node 315 and transistor 309'. Common current 360 pulls down the negative output path causing the negative output terminal to go low, and consequently, the output at the positive output terminal is high. Once the latch circuit 300 is latched, shared current path 360 will be maintained and the output signal at positive output node 313 and negative output node 315 will remain relatively constant regardless of any change in the input signal. Shared current path 360 passes through node 361 and is split and applied to the collector electrodes of transistors 307 and 307'. The emitter of transistor 307 is coupled to the collector of input transistor 301 and the emitter of transistor 307' is coupled to the collector of input transistor 303. When the input signal is high, positive input $in_p$ turns input transistor 301 on and positive path current $I_{pos}$ 364 flows from node 361 through transistor 307 and input transistor 301 to node 365. When the input signal is low, the negative input signal $in_n$ is high, causing input transistor 303 to turn on. A negative current path $I_{neg}$ 362 is established from node 361, through transistor 307' and input transistor 303 to node 365. Node 365 is connected to reference voltage VSS 330 through current source transistor 311, thereby defining a common current path 360' between node 365 and reference voltage VSS 330. The input signal changes as the comparator associated with latch circuit 300 flips causing the non-shared current path to switch from positive current path 364 to negative current path 362 or vice versa. The shared current path 360 will not change and the output from the latch circuit 300 will be provided at negative output node 315 at a relatively constant level. However, as the current switches between the positive current path 364 and negative current path 362, the output node 315 is subject to the current change or jitter due to its electrical connection to positive current 364 and negative current 362 at node 361. This changing current may manifest as a perturbation or glitch at the current output node 315 which degrades performance. This occurs because the rate at which the current slows and stops in the input transistor which is being turned off may not be linear with respect to the rate at which the current increases in the transistor that is being turned on. This causes fluctuations in the current levels in the circuit which are reflected as glitches or anomalies in the output signal.

Figure 3C:
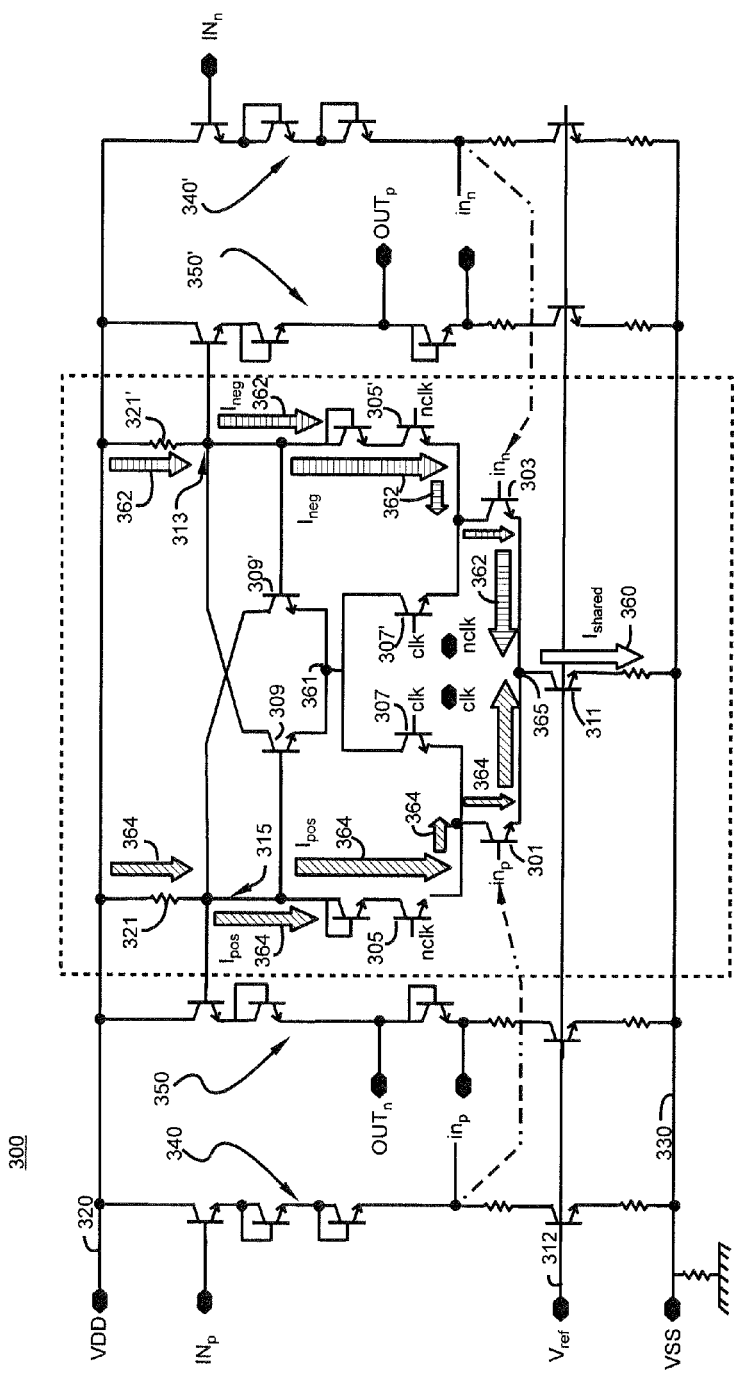
FIG. 3C is a schematic diagram of the latch circuit of FIG. 3A illustrating current flows through the latch circuit when the latch circuit is in an unlatched state.

Referring now to FIG. 3C, a schematic of the latch circuit 300 of FIG. 3A is provided illustrating the current flow present when the latch circuit 300 is in unlatched state. In an unlatched state, the output of the latch circuit 300, measured at positive output node 313 and negative output node 315 varies along with a change in the input signal. In an unlatched state, clock signal NCLK is provided to the bases of transistor 305 and transistor 305' and biases these transistors to turn them on. Meanwhile, clock signal CLK is applied to the bases of transistors 307 and 307' to turn transistors 307, 307' off. A first positive current path 364 is defined between reference voltage VDD 320 and reference voltage VSS 330 which passes through resistor 321, negative output node 315, transistor 305, and input transistor 301 to node 365. Similarly, a second negative current path 362 is defined between reference voltage VDD 320 and reference voltage VSS 330 which passes through resistor 321', positive output node 313, transistor 305', and input transistor 303 to node 365. A common current path 360 connects node 365 to reference voltage VSS 330 via current source of transistor 311. VDD 320 and VSS 330 may be configured to provide voltage levels which are sufficient to drive transistors connected between VDD 320 and VSS 320. By way of non-limiting example, VDD may be configured to provide +5 volts (V) while VSS is configured at zero (0) V. Reference voltage $V_{ref}$ may be configured between the values of VDD 330 and VSS 320, for example in an embodiment, $V_{ref}$ may be configured to provide +1V.

Based on the input signal, one of input transistor 301 and input transistor 303 will be on while the other transistor is off. Thus input transistors 301, 303 act as a differential transistor pair. When input transistor 301 is on, current flows along positive current path 364. Input transistor 303 is therefore turned off, and current does not flow through negative current path 362. Any change in input signal to input transistor 301 will be reproduced at negative output node 315 which is part of the positive current path 364. Likewise, when input transistor 303 is on based on the input signal, current flows along negative current path 362. Input transistor 301 is therefore turned off and current does not flow along positive current path 364. Any change in input signal to input transistor 303 will be reproduced at positive output node 313, which is part of negative current path 362.

As discussed above with reference to FIG. 3B, latch circuit 300 defines a shared current path 360 when the latch circuit 300 is in a latched state. The shared current path passes through the latched output node regardless of the input. That is, regardless of whether the positive current path 364 or the negative current path 362 is conducting based on the present input signal, current will flow through the output node of shared current path 360 when latch circuit 300 is in a latched state. Accordingly, when the input signal changes and the current path changes between negative current path 362 and positive current path 364, the change in current causes a transient state change observable as a signal perturbation or glitch at the output node of latch circuit 300 as a result of using the common (e.g. shared) current path 360.

Figure 4A:
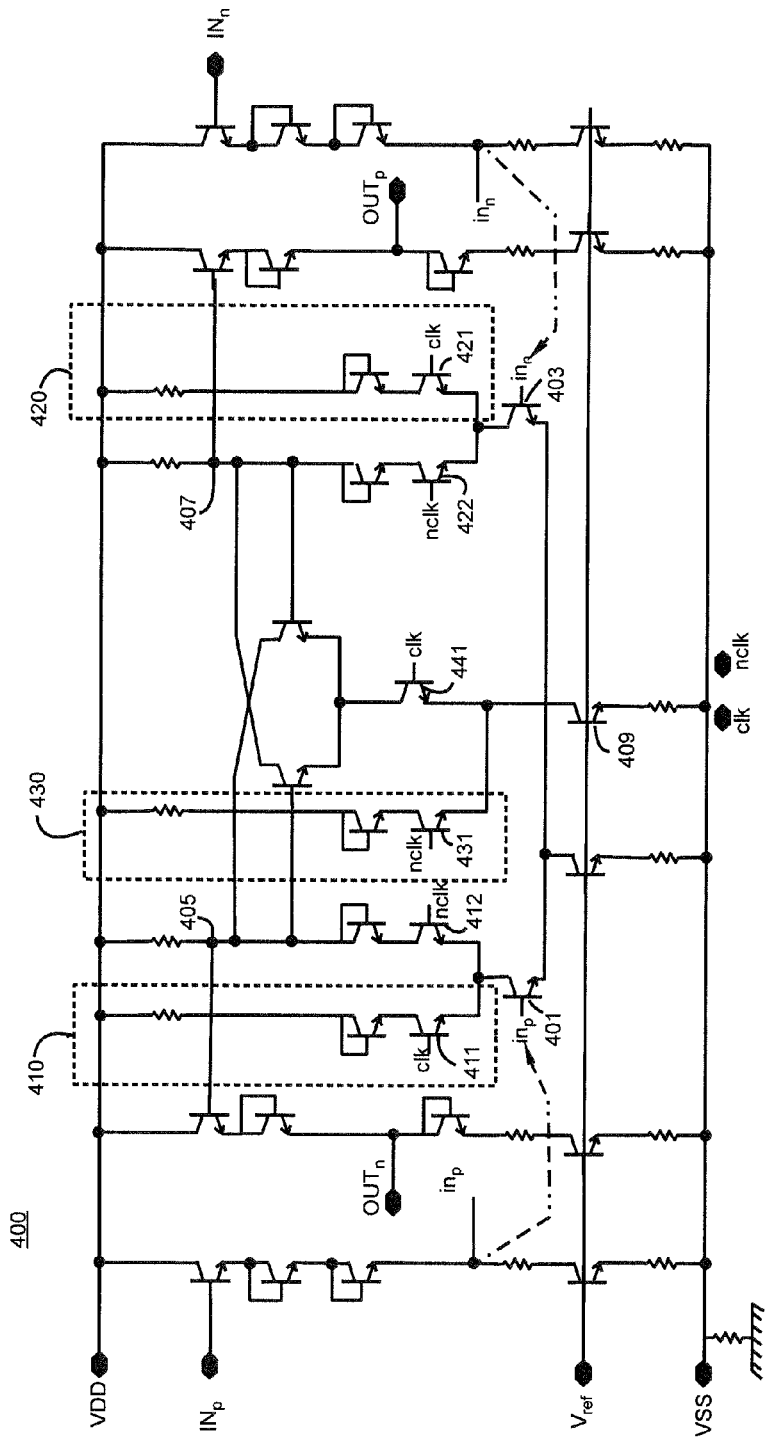
FIG. 4A is a schematic diagram of a latch circuit having isolated input and output bypass current paths according to an embodiment of this disclosure.

FIG. 4A is a schematic diagram of a latch circuit 400 according to an embodiment of this disclosure, which isolates the input current paths from the output nodes while the circuit is latched. The circuit comprises three sets of differential transistor pairs (411, 412; 421, 422; and 431, 441). A respective one of each pair receives a same clock (or inverse clock) signal (CLK, NCLK) that places the circuit in a latched or unlatched state. In addition, the differential transistor pair arrangements coupled with differential input transistor pair (401, 403) that receive the comparator output as input to the latch circuit, operate to (a) bypass the output nodes of the latch circuit with current via the input transistors when the latch circuit is in a latched state (e.g. when CLK is high and NCLK is low), and (b) direct current via the input transistors through the output nodes of the latch circuit when the latch circuit is in an unlatched state (e.g. when CLK is low and NCLK is high). Latch circuit 400 includes circuitry similar to the latch circuit 300 shown in FIG. 3A including input and output conditioning circuits (340, 350, shown in FIG. 3B). Latch circuit 400 further includes two isolated input bypass current paths 410, 420 and one isolated output bypass current path 430. When latch circuit 400 is latched, current is steered to one of input bypass current path 410 and input bypass current path 420. Current is steered via clock signal CLK, applied to the base of transistor 411 of output bypass current path 410 and to the base of transistor 421 of output bypass current path 420. A differential input signal is applied to input transistor 401 and input transistor 403. When positive input signal $In_p$ is high, signal $In_n$ is low. This configuration causes input transistor 401 to be turned on (bias on) while input transistor 403 is biased to an off state. Input transistor 401 thus draws all of the input current via input bypass current path 410. Input bypass current path 410 is isolated from negative output node 405. When the input signal changes ($In_p$ is low and $In_n$ is high), the input current paths 410, 420 flip and input transistor 403 draws all the input current and steers current through input bypass current path 420. Input bypass current path 420 is isolated from positive output node 407.

When latch circuit 400 is unlatched via CLK signal and the output signal is allowed to change with the input, isolated output bypass current path 430 is provided, which defines an output current path for current source 409. The output current path is isolated from negative output node 405 and positive output node 407. With reference to latch circuit 400, the inclusion of current source 409 and the provision of input bypass current paths 410, 420 enables latch circuit 400 to maintain a consistent output signal regardless of the state of the input signal. Moreover, in cases where the input signal changes causing the current path to change from the positive input current path to the negative input current path, glitches in the output due to the changing current levels through input transistors 401 and 403 are reduced or eliminated. The respective current paths through latch circuit 400 during a latched and unlatched state will now be described with reference to FIG. 4B and FIG. 4C.

Figure 4B:
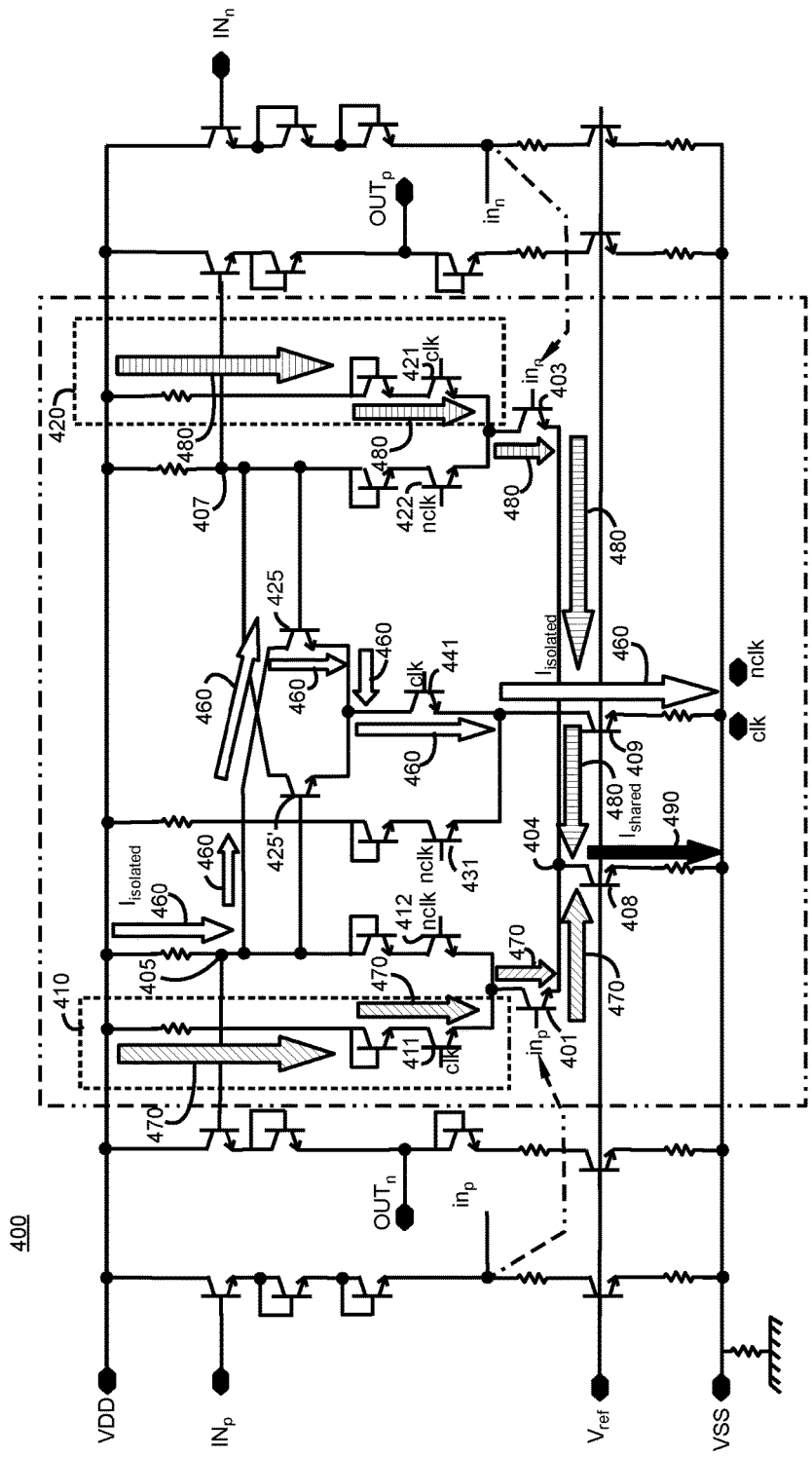
FIG. 4B is a schematic diagram of the latch circuit of FIG. 4A illustrating current flows through the latch circuit when the latch circuit is in a latched state according to an embodiment of this disclosure.

FIG. 4B is a schematic diagram of latch circuit 400 of FIG. 4A illustrating current flow through the latch circuit 400 when the latch circuit 400 is in a latched state. During a latched state, the output signal of the latch circuit 400 will remain effectively constant regardless of the state of the input signal applied to input transistors 401 and 403.

Referring to FIG. 4B, latch circuit 400 is in a latched state. The output signal of latch circuit 400 is measurable at negative output node 405 indicating that the input signal $In_p$ was high at the time the latch circuit 400 was placed into a latched state.

At time $T_{latch}$, when the latch circuit 400 was placed into a latched state, input signal $In_n$ was high, causing input transistor 401 to draw the input current through a current path including negative output node 405. Negative output node 405 is connected to the base of transistor 425' and biases transistor 425' in a non-conducting state. Latch circuit 400 is placed into a latched state by controlling clock signal CLK providing a high signal applied to the base of transistor 411, which controls current flow through input bypass current path 410, the base of transistor 421 controlling flow through input bypass current path 420, and to the base of transistor 441 which steers flow through the output current path. At the same time, clock signal NCLK will go low, and is applied to the base of transistor 412 associated with the positive input current path, the base of transistor 422 associated with the negative input current path, and the base of transistor 431 associated with the isolated output bypass current path (430, shown in FIG. 4A).

Transistor 441 is biased and draws an isolated output current along the isolated output current path denoted as 460. Isolated output current path 460 passes through transistor 425 which was biased by last positive input signal that was received by the latch circuit 400 at time $T_{latch}$. Isolated output current path 460 passes through negative output node 405, transistor 425, transistor 441 and current source 409. It should be noted that the input current paths (denoted as 470 and 480) are isolated from output nodes 405 and 407 and the output current path 460 is isolated from the current paths that pass through input transistor 401 and input transistor 403.

Referring now to isolated input bypass current paths 410 and 420, clock signal CLK is set high and biases transistor 411 of input bypass current path 410 and transistor 421 of input bypass current path 420. At the same time, transistor 412, coupled to first input transistor 401 and transistor 422, coupled to negative input transistor 403 receive clock signal NCLK, which is set low and are turned off. Once transistor 412 and transistor 422 are turned off, the input paths containing input transistors 401 and 403 are disconnected or isolated from their respective output nodes 405, 407. Accordingly, any change in the input signal which affects the state of input transistors 401 and 403 will have no effect on the current passing through output node 405 or output node 407.

When latched, input current through latch circuit 400 is created by the state of input transistors 401, 403. The input current will flow through one of input bypass current path 410 and input bypass current path 420. Input bypass current path 410 flows through transistor 411, input transistor 401 and node 404 via current source 408. Similarly, input bypass current path 420 flows through transistor 421, input transistor 403 to node 404 via current source 408. A common current path 490 is defined between node 404 and reference Voltage VSS through current source 408. While latch circuit 400 is latched, the input signal may change and change the states of input transistors 401 and 403. When the input changes, the input current path will switch and be steered through the input transistors which is biased by the current input signal. Any fluctuations in input current caused by the changing states of the input transistors 401 and 403 will not have any effect on the output signal because the input bypass current paths 410, 420 are isolated from the output nodes 405 and 407 by transistors 412 and 422, respectively. Thus, the latch circuit 400 of FIG. 4B allows the input current to change, while the output signal of the latch circuit 400 remains effectively constant, with the added benefit that minor changes in the input current causes by the switching of the input current path will not transmit glitches in the output signal.

Figure 4C:
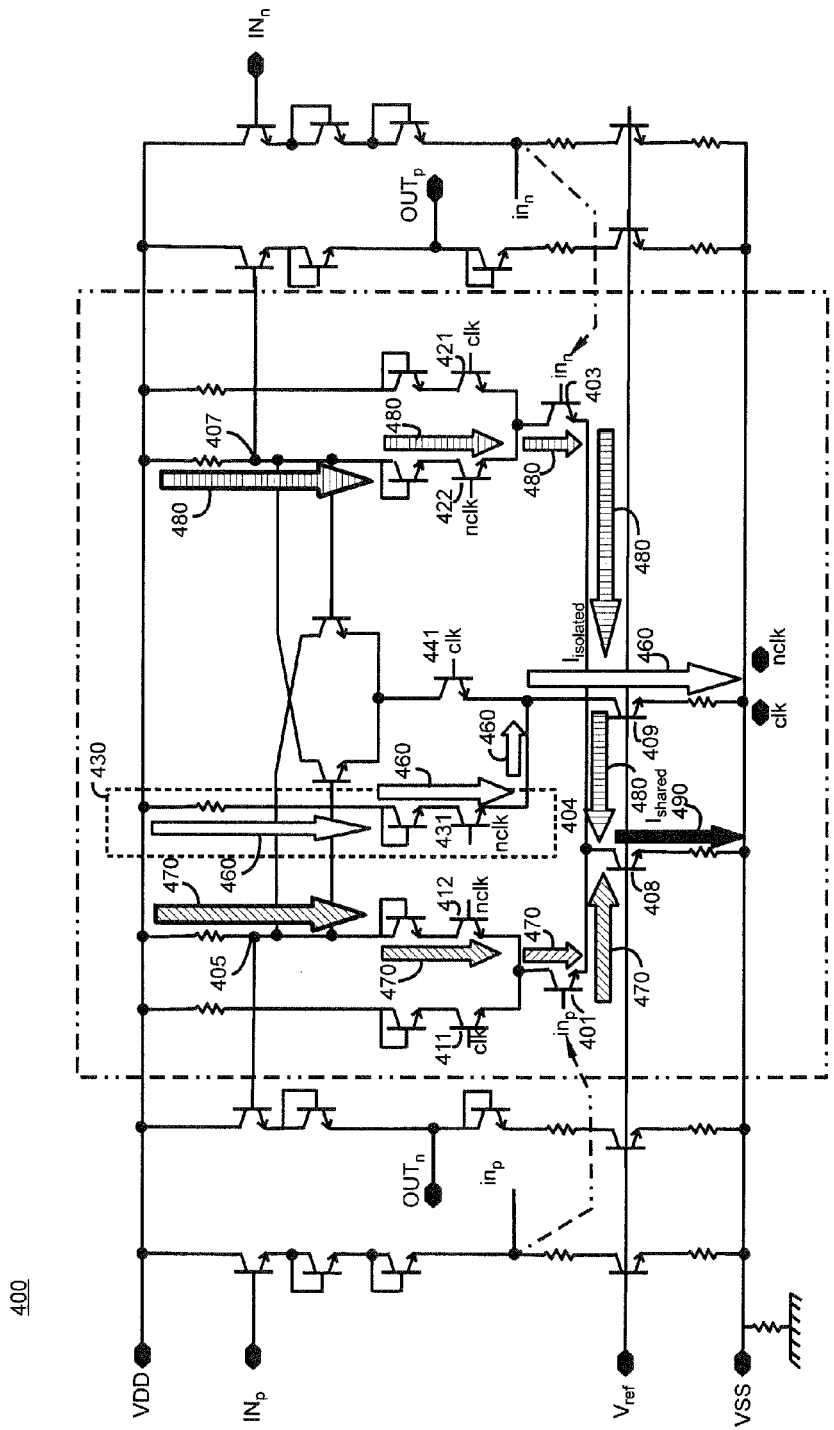
FIG. 4C is a schematic diagram of the latch circuit of FIG. 4A illustrating current flows through the latch circuit when the latch circuit is in an unlatched state according to an embodiment of this disclosure.

FIG. 4C is a schematic diagram of latch circuit 400 of FIG. 4A illustrating the current paths through the latch circuit 400 when the latch circuit 400 is in an unlatched state. In an unlatched state, changes in the input signal are reflected in the latch circuit output, allowing the output signal of latch circuit 400 to change (e.g. high to low) with the received input signal.

To unlatch latch circuit 400, clock signal NCLK is set high and applied to the base of transistor 431 of isolated output bypass current path 430, the base of transistor 412 of the positive input current path, and the base of transistor 422 of the negative input current path. Depending on the value of the input signal, either input transistor 401 will be biased or input transistor 403 will be biased to a conducting state. While biased, the input current will be drawn through the conducting input transistor. For example, if the input signal $In_p$ is high, input transistor 401 is biased and current is drawn through input transistor 401. In that case, a positive input current 470 flows through negative output node 405, through transistor 412, input transistor 401 and node 404 via current source 408. When the input signal $In_n$ is high, input transistor 403 is biased and current is drawn through input transistor 403. In this case, a negative input current 480 is drawn through positive output node 407 through transistor 422 and input transistor 403 and node 404 via current source 408. A common (e.g. shared) current path 490 is defined between node 404 and reference voltage VSS via current source 408, which is shared between the positive current path 470 and the negative current path 480. As may be observed, in an unlatched state the output signal of latch circuit 400 will be generated at one of negative output node 405 and positive output node 407. The output node producing the circuit output depends on which input transistor 401, 403 is biased based on the input signal. As the input signal changes, the input current continues to flow through one of the output nodes 405, 407. The output signal of the latch circuit 400 will follow the input signal. Meanwhile, isolated output current path 460 is provided through transistor 431 of output bypass current path 430 via current source 409. The isolated output current path 460 provides a current path for the current produced by current source 409 while the latch circuit 400 is unlatched.

The latch circuit 400 according to an embodiment of this disclosure provides an output current path and output node that is isolated from the input current paths when the latch circuit is latched while also providing an isolated output current path separate from the output nodes when the latch circuit 400 is unlatched. By isolating the input current paths while the circuit is latched, the output is immune from input feed-through which causes glitches in the latch circuit output resulting in poorer performance in applications such as a sub-ranging ADC.

Figure 5:
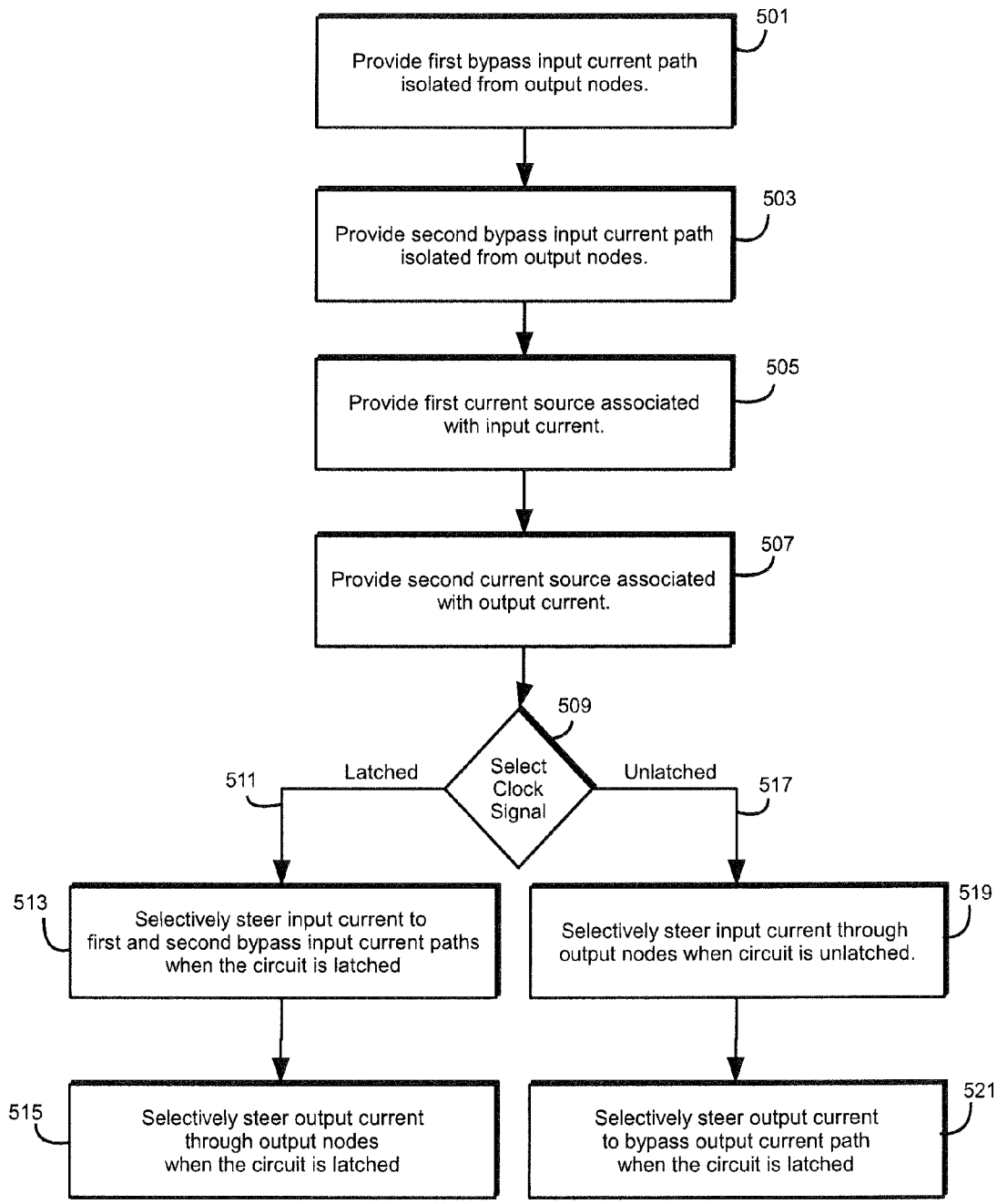
FIG. 5 is a process flow diagram showing a method for isolating input feed-through in a latch circuit according to an embodiment of this disclosure.

FIG. 5 is a process flow diagram showing a method for reducing input feed-through in a latch circuit according to an embodiment of the disclosure. The latch circuit includes a pair of input transistors which receive a differential input signal. Depending on the input signal, one of the input transistors will be biased by the input signal and draw the input current through a selectable input current path. To prevent input feed-through when the circuit is in a latched state, a first bypass input current path is provided in which the first bypass input current path is isolated from the positive and negative output nodes of the latch circuit 501. The first bypass input current path is in electrical communication with the first input transistor of the input transistor pair. A second bypass input current path is provided in which the second bypass input current path is isolated from the positive and negative output nodes of the latch circuit 503. The second bypass input current path is in electrical communication with the second input transistor of the input transistor pair.

A first current source is provided, the first current source associated with the pair of input transistors to produce an input current 505. A second current source is provided, the second current source associated with an output current of the latch circuit 507. A selectable clock signal is provided 509. The selectable clock signal is applied to the bases of a plurality of steering transistors which selectively steer the input current to a selected input current path. The selectable clock signal may be selected to place the latch circuit in a latched state 511 or an unlatched state 517. When the clock signal is selected to latch the latch circuit, the input current is selectively steered to one of the first bypass input current and second bypass input current paths 513. In this way the input current is separated from the output nodes of the latch circuit when the circuit is latched. This prevents changes in the input current path from producing input feed-through in the latch circuit output. Further, when the latch circuit is selectively latched, the output current is selectively steered through one of the output nodes in the pair of output nodes 515 to produce an effectively constant output signal.

When the clock signal is selected to unlatch the latch circuit 517, the input current is selectively steered through one of the output nodes in the pair of output nodes 519. In this way the output signal from the latch circuit follows changes in the input signal. Further, when the latch circuit is selectively unlatched, the output current is selectively steered through a bypass output current path that is isolated from the output nodes 521. The isolated bypass output current path provides a path for current to flow via the second current source associated with the output current while maintaining separation of the output current while the latch circuit is unlatched.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:
1. A latch circuit comprising:
 a pair of input transistors that receive a differential input signal, wherein a first input transistor receives a positive input signal and a second input transistor receives a negative input signal;

a plurality of steering transistors, each transistor in the plurality of steering transistors configured to receive one component of a differential clock signal;

a first bypass input current path coupled to the first input transistor, wherein the first bypass input current path is electrically isolated from a positive output node and a negative output node; and a second bypass input current path coupled to the second input transistor, wherein the second bypass input current path is electrically isolated from the positive output node and the negative output node;

wherein on a condition that the latch circuit is in a latched state, the differential clock signal is operative to selectively bias one or more of the plurality of steering transistors such that an input current based on the differential input signal is steered to one of the first bypass input current path or the second bypass input current path.

2. The latch circuit of claim 1, further comprising:
a bypass output current path, the bypass output current path being electrically isolated from the positive output node and the negative output node, wherein on a condition that the latch circuit is in an unlatched state, the differential clock signal is operative to selectively bias one or more of the plurality of steering transistors such that an output current is steered to the bypass output current path.

3. The latch circuit of claim 2 further comprising:
a first current source associated with the first input transistor and the second input transistor; and
a second current source independent of the first current source, the second current source configured to produce the output current.

4. The latch circuit of claim 3, wherein on a condition that the latch circuit is in a latched state, the differential clock signal is operative to selectively bias one or more of the plurality of steering transistors such that the output current is steered through one of the positive output node and the negative output node via the second current source.

5. The latch circuit of claim 3, wherein on a condition that the latch circuit is in an unlatched state, the differential clock signal is operative to selectively bias one or more of the plurality of steering transistors such that the output current is steered through the bypass output current path via the second current source.

6. The latch circuit of claim 3, wherein on a condition that the latch circuit is in a latched state, the differential clock signal is operative to selectively bias one or more of the plurality of steering transistors such that an input current is steered through one of: the first input transistor on the first bypass input current path and the second input transistor receiving the negative input signal on the second bypass input current path, via the first current source.

7. The latch circuit of claim 3, wherein on a condition that the latch circuit is in an unlatched state, the differential clock signal is operative to selectively bias one or more of the plurality of steering transistors such that an input current is steered through one of: the first input transistor on a first input current path that includes the negative output node and the second input transistor receiving the negative input signal on a second input current path that includes the positive output node, via the first current source.

8. The latch circuit of claim 7, wherein the first bypass input current path and the first input current path that includes the negative output node are electrically parallel to one another and commonly connected in series with the first input transistor.

9. The latch circuit of claim 7, wherein the second bypass input current path and the second input current path that includes the positive output node are electrically in parallel to one another and commonly connected in series with the second input transistor receiving the negative input signal.

10. The latch circuit of claim 3, further comprising:
a pair of output transistors commonly connected at source electrodes of the pair of output transistors, a collector electrode of a first output transistor being connected to the negative output node and a collector electrode of a second output transistor being connected to the positive output node, wherein on a condition that the latch circuit is in a latched state, the output current is steered through one of the negative output node and the first output transistor via the second current source, and the positive output node and the second output transistor via the second current source.

11. The latch circuit of claim 1, wherein the plurality of steering transistors comprises a first pair of steering transistors, a first steering transistor of the first pair of steering transistors associated with the first bypass input current path and configured to receive a first clock signal (CLK) of the differential clock signal at its base electrode, and a second steering transistor of the first pair of steering transistors associated with a current path containing the negative output node, configured to receive a second clock signal (NCLK) of the differential clock signal complementary with the first clock signal (CLK), at its base electrode such that dependent on the differential clock signal, only one of the first steering transistor and the second steering transistor of the first pair of steering transistors is biased at a given time.

12. The latch circuit of claim 11, wherein the plurality of steering transistors comprises a second pair of steering transistors, a first steering transistor of the second pair of steering transistors associated with the second bypass input current path and configured to receive the first clock signal (CLK) of the differential clock signal at its base electrode and a second steering transistor of the second pair of steering transistors associated with a current path containing the positive output node, configured to receive the second clock signal (NCLK) of the differential clock signal at its base electrode such that dependent on the differential clock signal, only one of the first steering transistor and the second steering transistor of the second pair of steering transistors is biased at a given time.

13. A method of preventing input feed-through in a latch circuit, the method comprising the steps of:
defining a first bypass input current path, which is isolated from output nodes of the latch circuit, the first bypass input current path associated with a first input transistor of the latch circuit;
defining a second bypass input current path, which is isolated from the output nodes of the latch circuit, the second bypass input current path associated with a second input transistor of the latch circuit;
connecting a first current source to one or more input current paths;
connecting a second current source to one or more output current paths;
selectively applying a differential clock signal to a plurality of steering transistors, the differential clock signal operable to place the latch circuit in a first state in which the latch circuit is latched and a second state in which the latch circuit is unlatched;
selectively steering an input current associated with one of the first input transistor and the second input transistor through at least one of the first bypass input current path and the second bypass input current path, and selectively steering an output current through at least one of a first output node and a second output node on a condition that the latch circuit is placed in the first state in which the latch circuit is latched.

14. The method of claim 13, further comprising:
selectively steering the input current associated with one of the first input transistor and the second input transistor through at least one of the output nodes of the latch circuit and selectively steering the output current through a bypass output current path, which is isolated from the output nodes of the latch circuit on a condition that the latch circuit is placed in the second state in which the latch circuit is unlatched.

15. The method of claim 14 wherein selectively applying the differential clock signal further comprises:
generating a first clock signal (CLK);
generating a second clock signal (NCLK), wherein the first clock signal (CLK) and the second clock signal (NCLK) form a differential clock signal;
applying the first clock signal (CLK) to a base of a steering transistor in electrical communication with the first bypass input current path and to a base of a steering transistor in electrical communication with the second bypass input current path; and
applying the second clock signal (NCLK) to a base of a steering transistor in electrical communication with the first output node of the latch circuit and to a base of a steering transistor in electrical communication with the second output node of the latch circuit.

16. The method of claim 15 wherein selectively applying the differential clock signal further comprises:
applying the second clock signal (NCLK) to a base of a steering transistor in electrical communication with the bypass output current path; and
applying the first clock signal (CLK) to a base of a steering transistor in electrical communication with one of the first output node and the second output node of the latch circuit.

17. The method of claim 15 further comprising the step of:
placing the latch circuit into the first state by performing the steps of:
setting the second clock signal (NCLK) to high;
setting the first clock signal (CLK) to low;
applying the second clock signal (NCLK) to the base of a steering transistor associated with a first input current path containing the first output node;
applying the second clock signal (NCLK) to the base of a steering transistor associated with a second input current path containing the second output node;
applying the first clock signal (CLK) to the base of a steering transistor associated with the first bypass input current path; and
applying the first clock signal (CLK) to the base of a steering transistor associated with the second bypass input current path.

* * * * *